(12) United States Patent
Meyers

(10) Patent No.: US 7,503,155 B2
(45) Date of Patent: Mar. 17, 2009

(54) METHOD FOR PACKAGING A TAPE SUBSTRATE

(76) Inventor: John G. Meyers, 2683 13th St., Sacramento, CA (US) 95818

( * ) Notice: Subject to any disclaimer, the term of this patent is extended or adjusted under 35 U.S.C. 154(b) by 1058 days.

(21) Appl. No.: 10/228,617

(22) Filed: Aug. 26, 2002

(65) Prior Publication Data

US 2004/0209400 A1    Oct. 21, 2004

(51) Int. Cl.
*B26D 7/02* (2006.01)
(52) U.S. Cl. .............. 53/396; 53/429; 53/532; 53/540
(58) Field of Classification Search ........... 53/396, 53/429, 532, 540; 438/111, 112, 123, FOR. 366, 438/FOR. 367, FOR. 377, FOR. 380, 109, 438/FOR. 368, FOR. 426; 257/666–677, 257/E23.031–23.059, 686, 777, E25.006, 257/E25.013, E25.018, E25.021, E25.027, 257/E23.085, E21.614
See application file for complete search history.

(56) References Cited

U.S. PATENT DOCUMENTS

| | | | | |
|---|---|---|---|---|
| 4,601,689 A | * | 7/1986 | Finkle et al. | 493/251 |
| 5,776,797 A | * | 7/1998 | Nicewarner et al. | 438/107 |
| 6,121,676 A | * | 9/2000 | Solberg | 257/686 |
| 6,225,688 B1 | * | 5/2001 | Kim et al. | 257/686 |
| 7,033,911 B2 | * | 4/2006 | Manepalli et al. | 438/455 |

* cited by examiner

*Primary Examiner*—Hemant M Desai
(74) *Attorney, Agent, or Firm*—Blakely, Sokoloff, Taylor & Zafman LLP

(57) ABSTRACT

A process and apparatus for packaging a tape substrate are provided. A first chip is encapsulated to a first side of a tape substrate to form a first capsule in a first segment of the tape substrate. The first segment of the tape substrate is secured to a first clamping element. A second segment of the tape substrate adjacent the first segment is secured to a second clamping element. At least one of the first segment and the second segment is moved to stack the second segment over the first capsule. The first clamping element and second clamping element can move independently of each other.

17 Claims, 6 Drawing Sheets

METHOD FOR PACKAGING A TAPE SUBSTRATE

FIELD

Embodiments of the present invention relate, in general, to device manufacturing and packaging and, more particularly, to the packaging of a device with multiple units formed on a tape substrate.

BACKGROUND

Device packaging is an important part of semiconductor device manufacturing processes. A process for packaging multiple device dies into a single device package includes bonding the device dies on a tape substrate and packaging the dies and the tape substrate into a single device. One such packaging process includes folding the tape substrate to stack the multiple device dies bonded thereon together. The adhesives dispensed between the dies in the stack are cured, thereby holding the dies in the stack together.

An apparatus used for such a tape substrate packaging process typically has mechanical fingers and pusher to handle the dies and the tape substrate. Specifically, the mechanical fingers and pushers stack the dies together. Another apparatus design may include a hinged assembly to fold the tape substrate. Currently, the adhesive dispensing is generally performed manually or by equipment separate from the device packaging apparatus.

The mechanical fingers and pusher, or hinged assembly in an existing packaging apparatus are generally deficient in ensuring accurate positions of the dies and tape substrate during the packaging process. In addition, the apparatus generally does not integrate adhesive dispensing and curing into the device packaging process. The apparatus is not easily modifiable for packaging different devices. The tape substrate device packaging processes using the existing apparatuses are generally time consuming.

BRIEF DESCRIPTION OF THE DRAWINGS

The accompanying drawings, which are incorporated in and form a part of this specification, illustrate embodiments of the present invention and, together with the description, serve to explain the principles of the present invention.

DETAILED DESCRIPTION

Reference will now be made to the several embodiments of the invention, examples of which are illustrated in the accompanying drawings. While the present invention will be described in conjunction with the different embodiments, it will be understood that they are not intended to limit the invention to these embodiments. On the contrary, the present invention is intended to cover alternatives, modifications and equivalents, which may be included within the spirit and scope of the invention as defined by the claims. Moreover, in the following detailed description of the present invention, numerous specific details are set forth in order to provide a thorough understanding of the present invention. However, the present invention may be practiced without these specific details. In other instances, well-known methods, procedures, components and circuits have not been described in detail as not to unnecessarily obscure aspects of the present invention.

Figure 1:
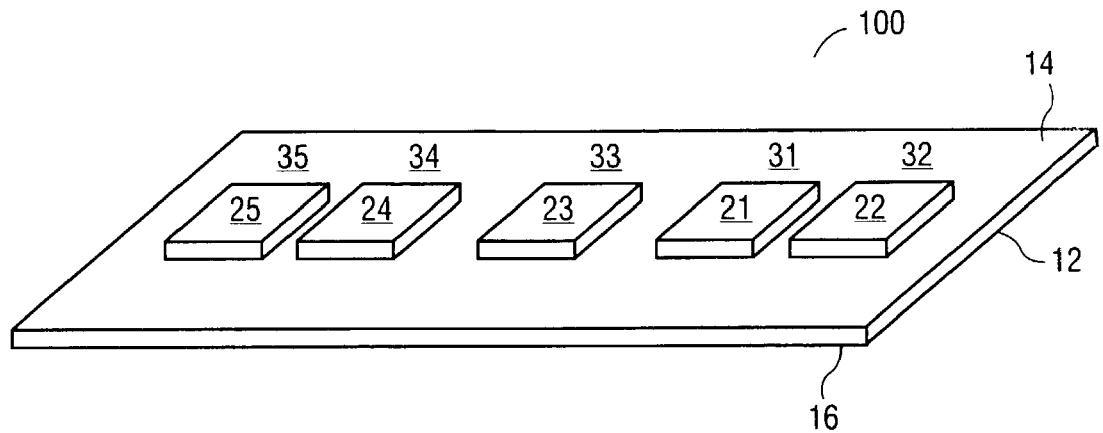
FIG. 1 illustrates one embodiment of a device to be packaged in accordance with the present invention.

FIG. 1 illustrates a device 100 to be packaged in accordance with the present invention. By way of example, device 100 is a semiconductor device that includes a plurality of device dies or chips encapsulated on a tape substrate 12. FIG. 1 shows five device units formed on a front side 14 of tape substrate 12, each unit may include one or more dies encapsulated therein. Specifically, device 100 includes device units 21, 22, 23, 24, and 25, which are also referred to as capsules, formed in sections 31, 32, 33, 34, and 35, respectively, of tape substrate 12. The sections in tape substrate 12 are also referred to as segments.

The minimum distance between two adjacent device units on tape substrate 12 depends on the thickness and flexibility of tape substrate 12 as well as the thickness of the device units. By way of example, FIG. 1 shows that the distance between device units 23 and 24 is greater than those between device units 21 and 22 and between device units 24 and 25, but less than that between device units 21 and 23. This specific distance arrangement is used for packaging, in which device units 21-25 are stacked together in a specific order described herein after with reference to FIGS. 6A-6H. When the order in which device units 21-25 are stacked together changes, the arrangement of the minimum distances between adjacent device units also change accordingly. Alternatively, the distances between adjacent device units are uniform throughout tape substrate 12 at a value sufficient for stacking device units 21-25 in various orders.

In one example, each of device units 21-25 has a thickness of approximately 0.2 millimeter (mm) and tape substrate 12 is about 0.1 mm thick. In such an example, the minimum distance between device units 21 and 22 and between device units 24 and 25 is approximately 0.9 mm. The minimum distance between device unit 23 and 24 is approximately 1.5 mm, and the minimum distance between device units 21 and 23 is approximately 2.1 mm.

The electronics circuits in device units 21-25 communicate with each other through conductive paths formed in tape substrate 12 between front side 14 and a back side 16. Ball grid arrays (not shown) may be formed on back side 16, thereby enabling the communication between device 100 with other devices and circuits. The location of the ball grid arrays depends on the order in which device units 21-25 are stacked together. In accordance with one embodiment, one ball grid array is formed on back side 16 of tape substrate 12 in section 31. In another embodiment, two ball arrays are formed on back side 16 of tape substrate 12, one in section 31 and another in section 33.

Encapsulating dies on tape substrate 12 to form device units 21-25 may include such procedures as molding, encapsulating, and sealing, which are known in the art. Prior to encapsulation, molding, or sealing, other processes such as, for example, wire bonding, lead bonding, bump bonding, and die stacking may be performed upon device units 21-25 prior to encapsulation. After encapsulation, molding, or sealing, device units 21-25 may be subject to additional processes such as ball attaching, marking, etc.

It should be noted that, in accordance with an embodiment of the present invention, device units 21-25 are not limited to being formed using those procedures described herein above. It should also be noted that device 100 is not limited to having five device units formed thereon. In accordance with the present invention, device 100 may include any number of device units formed on tape substrate 12. Furthermore, device 100 is not limited to having device units formed on front side 14 of tape substrate 12. A device packaging apparatus and a packaging process in accordance with the present invention are also capable of packaging a device with device units formed on both front side 14 and back side 16 of tape substrate 12.

Figure 2:
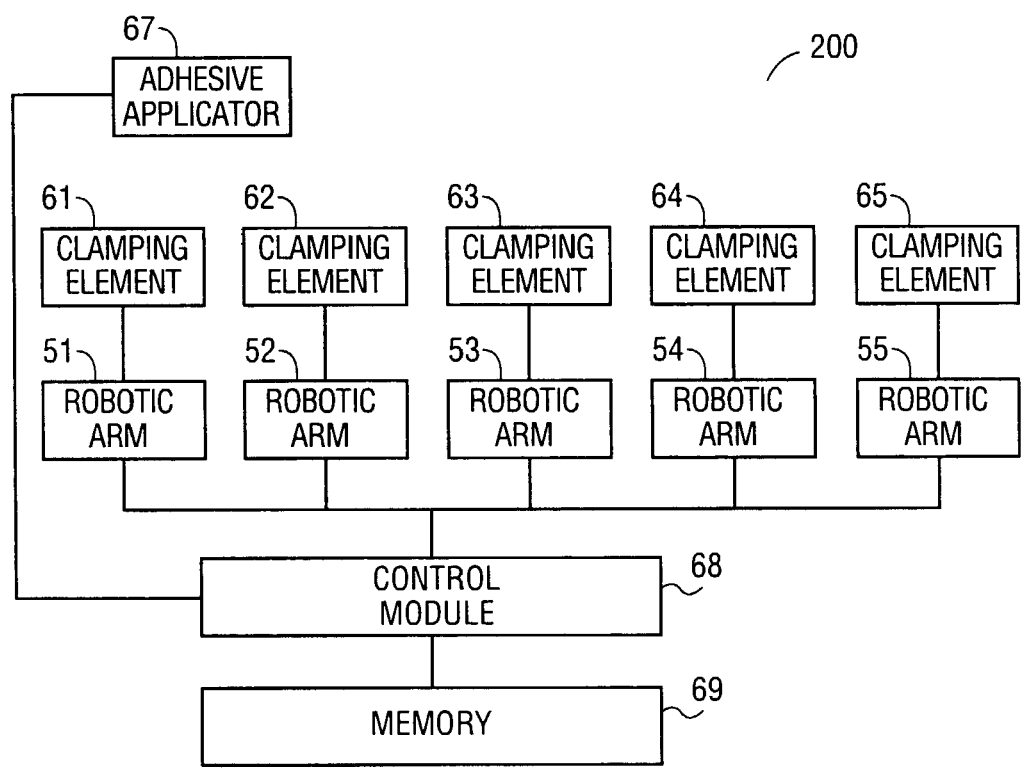
FIG. 2 is a functional block diagram illustrating one embodiment of an apparatus for performing a packaging process in accordance with the present invention.

FIG. 2 is a diagram illustrating one embodiment of a device packaging apparatus 200 for performing a multiple chip packaging process in accordance with the present invention. Apparatus 200 includes a plurality of robotic arms 51 and 52. A plurality of clamping elements 61 and 62 are attached to respective robotic arms 51 and 52. In one embodiment, clamping elements 61 and 62 include vacuum chucks. Apparatus 200 further includes an adhesive applicator 67. In one embodiment, adhesive applicator 67 applies an adhesive tape or film during the packaging process. In another embodiment, adhesive applicator 67 applies a fluid adhesive, e.g., epoxy. A control module 68 is coupled to robotic arms 51 and 52, clamping elements 61 and 62, and adhesive applicator 67. By way of example, control module 68 includes a microprocessor (MP) or a central processing unit (CPU). Control module 68 is also coupled to a memory 69, which stores program routines for the operation of apparatus 200.

Although FIG. 2 shows apparatus 200 as having two robotic arms 51 and 52, two clamping elements 61 and 62, and one adhesive applicator 67, this is not intended as a limitation on the scope of the present invention. Depending on the characters of the devices to be packaged, apparatus 200 may include any plural number of robotic arms and clamping elements. Apparatus 200 may also include more than one adhesive applicator. In an alternative embodiment, apparatus 200 includes several adhesive applicators for applying different types of adhesives. Furthermore, apparatus 200 may include other elements not shown in FIG. 2. In one embodiment, apparatus 200 includes a heating element. In another embodiment apparatus 200 includes a cooling element. In yet another embodiment, apparatus 200 includes a source of electromagnetic radiation, e.g., infrared radiation, microwave radiation, etc. Apparatus 200 may also include a combination of the above mentioned elements. Different variations of the packaging process in accordance with alternative embodiments of the present invention determine what elements that apparatus 200 includes.

In operation, control module 68 executes the program routines stored in memory 69 and controls robotic arms 51 and 52, clamping elements 61 and 62, and adhesive applicator 67 to package a multiple die device such as device 100 shown in FIG. 1. The mechanism for operating robotic arms 51 and 52, clamping elements 61 and 62, and adhesive applicator 67 may include robotic, electromechanical, electromagnetic, pneumatic, hydraulic, etc. In one embodiment, robotic arms 51 and 52 can move and rotate independently of each other, thereby enabling apparatus 200 to precisely package devices of various characters.

Apparatus 200 is capable of packaging multiple die devices of various characters. By executing the program routines stored in memory 69, control module 68 instructs robotic arms 51-55, clamping elements 61-65, and adhesive applicator 67 to perform the packaging process. The program routines can be modified to accommodate devices of different characters, which include tape substrate thickness and flexibility, device unit thickness and dimension, the number and locations of the device units on the tape substrate, etc. The program routines can also be modified to apply different adhesives and use different elements to cure the adhesives.

FIGS. 3A-3D illustrates a device packaging process in accordance with an embodiment of the present invention. The process uses a device packaging apparatus like apparatus 200 shown in FIG. 2 to package a device 100 having two device units 21 and 22 formed on front side 14 of tape substrate 12. Specifically, device units 21 and 22 are formed in segments 31 and 32, respectively, of tape substrate 12.

Figure 3A:
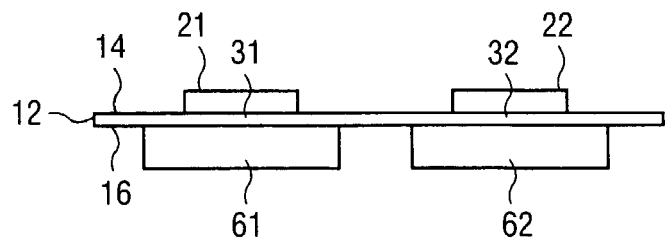
FIGS. 3A-3D illustrates one embodiment of a device packaging process in accordance with an aspect of the present invention.

As shown in FIG. 3A, segments 31 and 32 of tape substrate 12 are secured to clamping elements 61 and 62, respectively, of apparatus 200. In one embodiment, clamping elements 61 and 62 are vacuum chucks. Device 100 is secured to clamping elements 61 and 62 by placing back side 16 of tape substrate 12 in segments 31 and 32 over the vacuum chucks and turning on vacuum chucks 61 and 62.

Figure 3B:
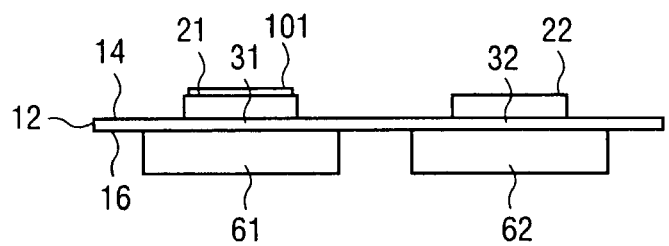

In a next step, as shown in FIG. 3B, an adhesive 101 is applied on device unit 21 using adhesive applicator 67 of FIG. 2. Adhesive 101 can be a paste or fluid adhesive such as epoxy; it can also be an adhesive tape or film. It should be noted that adhesive 101 is not limited to being applied on device unit 21. In accordance with an embodiment of the present invention, adhesive can be applied on device unit 21, device unit 22, or both. Further, adhesive 101 is not limited to being applied to completely cover the whole top surface of device unit 21.

Figure 3C:
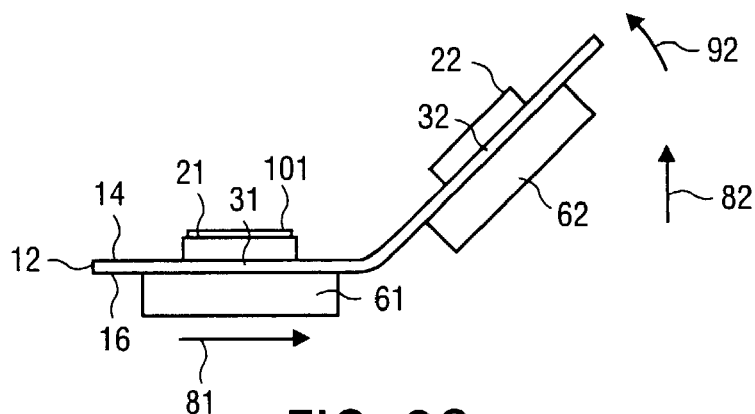

In FIG. 3C, clamping element 61 moves in a first direction toward clamping element 62 as indicated by an arrow 81. Clamping element 62 moves in a second direction, as indicated by an arrow 82, substantially perpendicular to first direction 81. In addition, clamping element 62 rotates in a direction indicated by an arrow 92 to bend or fold tape substrate 12. In accordance with an embodiment of the present invention, clamping element 62 rotates over an angle of approximately 180 degrees (°) to place device unit 22 substantially facing device unit 21. It should be noted that the motion of clamping element 61 in first direction 81 toward clamping element 62 is optional in a packaging process in accordance with the present invention. In an alternative embodiment, clamping element 61 does not move, and clamping element 62 rotates and moves toward clamping element 61, thereby avoiding over stretching tape substrate 12.

Figure 3D:
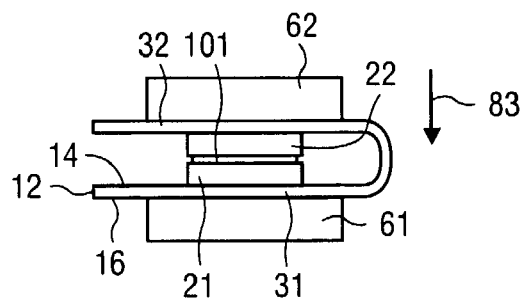

In FIG. 3D, clamping element 62 moves in a third direction, as indicated by an arrow 83, substantially perpendicular to second direction 82 shown in FIG. 3C to place device unit 22 in substantial contact with device unit 21. In one embodiment, device unit 22 is in good contact with adhesive 101 applied on device unit 21. This can be achieved by applying a force on device 100 through clamping elements 61 and 62 to press device units 21 and 22 against each other.

After clamping elements 61 and 62 stack device units 21 and 22 together as described above, adhesive 101 is cured. Curing adhesive 101 may be as simple as holding device units 21 and 22 in place by clamping elements 61 and 62 for a period long enough for adhesive 101 to be cured. The curing period generally depends on the characteristics of adhesive 101 and curing conditions. The curing condition may be changed up by altering the environment surrounding device 100. For example, the curing condition can be changed by taking such actions as heating device units 21 and 22, cooling device units 21 and 22, irradiating device units 21 and 22 with an electromagnetic radiation, e.g., infrared radiation, microwave radiation, etc., or any combination thereof. What actual actions to take depends on the characteristics of adhesive 101.

After curing adhesive 101, clamping elements 61 and 62 are detached or released from respective segments 31 and 32 of tape substrate 12. The packaging is completed.

Figure 4:
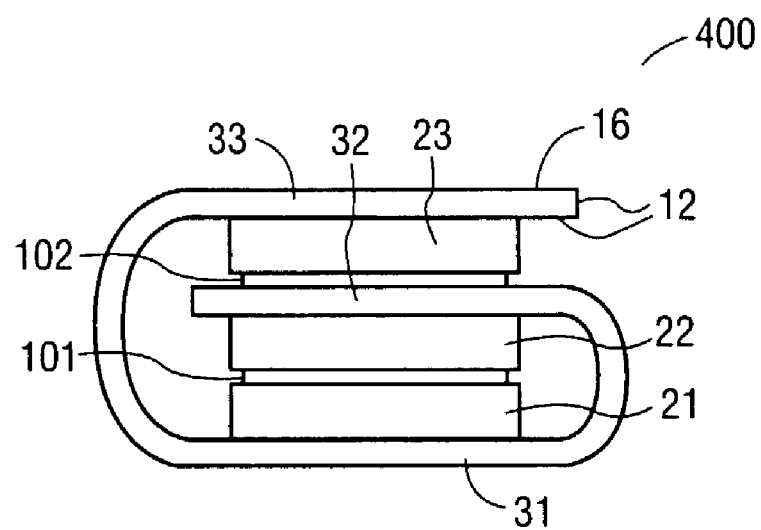
FIG. 4 illustrates one embodiment of a semiconductor device after being packaged in accordance with the present invention.

FIG. 4 shows a semiconductor device 100 after being packaged in accordance with an embodiment of the present invention. Device 400 shown in FIG. 4 has three capsules or device units formed on front side 14 of tape substrate 12. The packaging of device 100 shown in FIG. 4 is similar to that described herein above with reference to FIGS. 3A-3D.

First, sections 31, 32, and 33, on which respective device units 21, 22, and 23 are formed, are secured to three clamping elements, e.g., clamping elements 61, 62, and 63 of apparatus 200 shown in FIG. 2. Adhesive 101 is applied on device unit 21, device unit 22, or both. The clamping element which secures section 32 of tape substrate 12 rotates and moves to place device unit 22 facing and in substantial contact with device unit 21. The clamping element is then released from section 32 of tape substrate 12. In one embodiment, the adhesive 101 is cured before releasing the clamping element from section 32 of tape substrate 12.

In a subsequent step, an adhesive 102 is applied on device unit 23, back side 16 of tape substrate 12 in section 32, or both. Adhesive 102 can be of the same type as or different from adhesive 101. The clamping element securing section 33 of tape substrate 12 moves and rotates for approximately 180° to place device unit 23 facing and in contact with section 32 of tape substrate 12. In one embodiment, adhesive 102 is cured before releasing the clamping elements from sections 31 and 33 of tape substrate 12.

Depending on their properties, the curing of adhesives 101 and 102 may include heating device, cooling device, irradiating device with a radiation, or any combination thereof. Adhesives 101 and 102 may be cured at different times or all at once after device units 21, 22, and 23 are stacked together.

Figure 5:
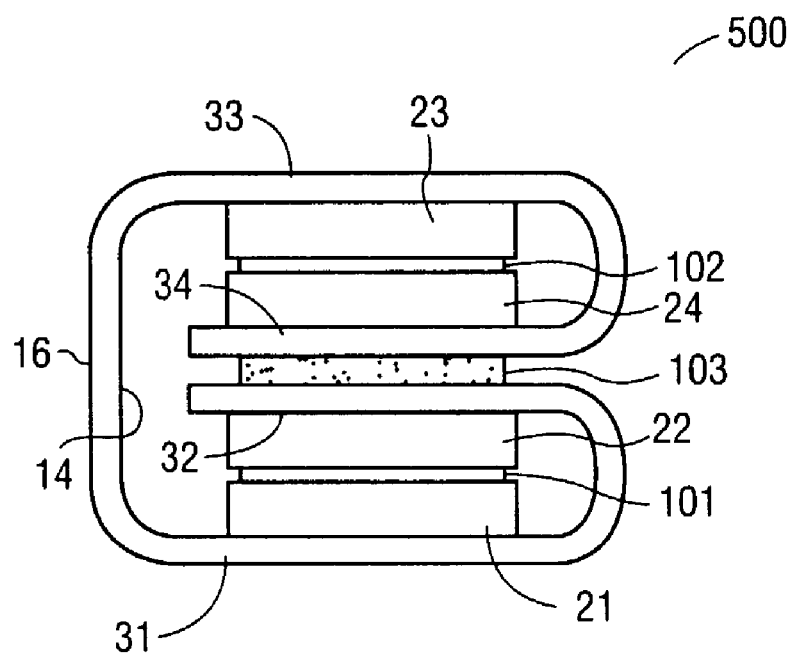
FIG. 5 illustrates an alternative embodiment of another semiconductor device after being packaged in accordance with the present invention.

FIG. 5 shows another device 100 after being packaged in accordance with an embodiment of the present invention. Device 500 shown in FIG. 5 has four capsules or device units formed on front side 14 of tape substrate 12. FIG. 4 shows that section 32 is on one side of section 31 and section 33 is on the other side of section 31 of tape substrate 12. Further, section 34 is adjacent section 33 and on the opposite side of section 33 from section 31. The packaging of device 100 shown in FIG. 5 is similar to those described herein above with reference to FIGS. 3A-3D and FIG. 4.

First, sections 31, 32, 33, and 34, on which respective device units 21, 22, 23, and 24 are formed, are secured to three clamping elements, e.g., clamping elements 61, 62, 63, and 64 of apparatus 200 shown in FIG. 2. An adhesive 101 is applied on at least one of device unit 21 and device unit 22. The clamping element securing section 32 of tape substrate 12 rotates and moves to place device unit 22 facing and in substantial contact with device unit 21. An adhesive 102 is applied on at least one of device unit 23 and device unit 24. The clamping element securing section 34 of tape substrate 12 rotates and moves to place device unit 24 facing and in substantial contact with device unit 23. The clamping elements are then released from sections 32 and 34 of tape substrate 12. In one embodiment, the adhesives 101 and 102 may be cured before releasing the clamping elements from sections 32 and 34 of tape substrate 12.

An adhesive 103 is applied on back side 16 of tape substrate 12 in at least one of sections 32 and 34. The clamping element securing section 33 of tape substrate 12 moves and rotates for approximately 180° to place section 34 facing and in contact with section 32 of tape substrate 12. In one embodiment, the adhesive 103 is cured before releasing the clamping elements from sections 31 and 33 of tape substrate 12.

Depending on their properties, the curing of adhesives 101, 102, and 103 may include heating device, cooling device, irradiating device with an electromagnetic radiation, or any combination thereof. Adhesives 101, 102, and 103 may be cured at different times or all at once after device units 21, 22, 23, and 24 are stacked together.

Figure 6A:
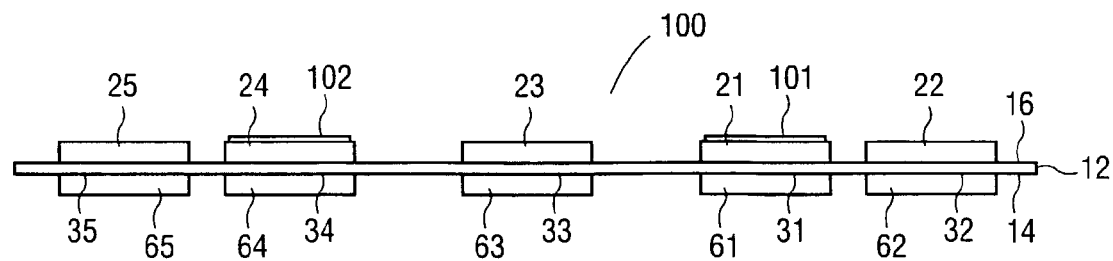
FIGS. 6A-6H illustrates one embodiment of a device packaging process in accordance with another aspect of the present invention.

FIGS. 6A-6H illustrate a device packaging process in accordance with another embodiment of the present invention. The process uses a device packaging apparatus like apparatus 200 shown in FIG. 2 to packaging a device 100 having five device units 21, 22, 23, 24, and 25 formed on front side 14 of tape substrate 12. Specifically, device units 21, 22, 23, 24, and 25 are formed in segments 31, 32, 33, 34, and 35, respectively, of tape substrate 12. FIG. 6A shows that segment 32 is on one side of segment 31 and segments 33, 34, and 35 are on the other side of segment 31. Furthermore, segment 33 is located between segments 31 and 34, and segment 34 is located between segments 33 and 35. The packing of device 100 with device units 21-25 is similar to those described herein above with reference to FIGS. 3A-3D, FIG. 4, and FIG. 5.

As shown in FIG. 6A, segments 31, 32, 33, 34, and 35 of tape substrate 12 are secured to clamping elements 61, 62, 63, 64, and 65, respectively, of apparatus 200. In one embodiment, clamping elements 61-65 are vacuum chucks. Device 100 is secured to clamping elements 61-65 by placing back side 16 of tape substrate 12 in segments 31-35 on the vacuum chucks and turning on vacuum chucks 61-65. An adhesive 101 is applied on device unit 21, device unit 22, or both. An adhesive 102 is applied on at least one of device unit 24 and device unit 25.

Figure 6B:
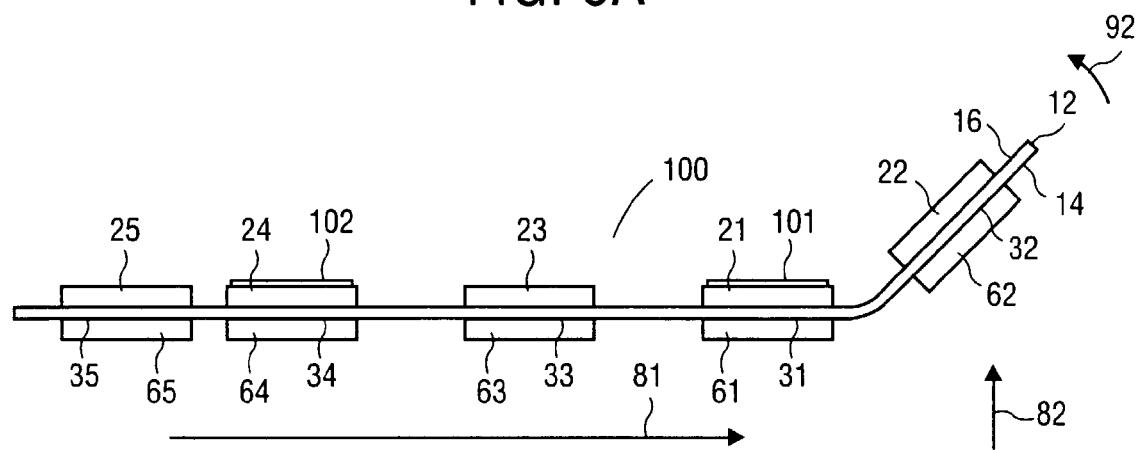

In a subsequent step, clamping elements 61, 63, 64, and 65 move in a first direction toward clamping element 62 as indicated by an arrow 81 in FIG. 6B. Clamping element 62 moves in a second direction, as indicated by an arrow 82 in FIG. 6B, substantially perpendicular to first direction 81. In addition, clamping element 62 rotates in a direction indicated by an arrow 92 in FIG. 6B for approximately 180° to bend or fold tape substrate 12 and to place device unit 22 substantially facing device unit 21.

Figure 6C:
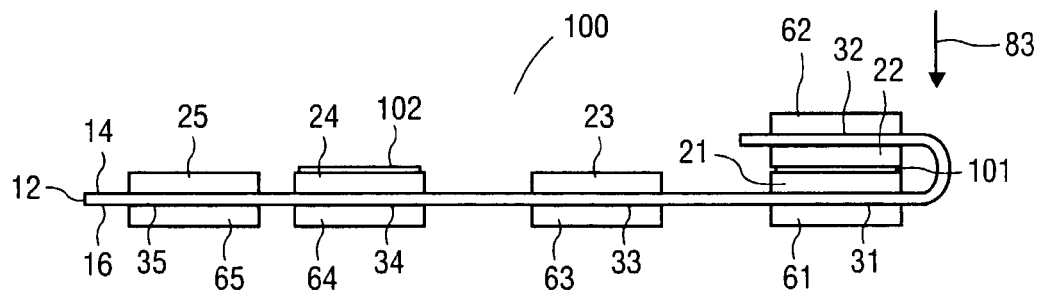

In FIG. 6C, clamping element 62 moves in a third direction, as indicated by an arrow 83, substantially opposite to second direction 82 shown in FIG. 6B to place device unit 22 in substantial contact with device unit 21. Device unit 22 is in good contact with adhesive 101 applied on device unit 21. This can be achieved by asserting a force on device 100 through clamping elements 61 and 62 to press device units 21 and 22 against each other. After clamping elements 61 and 62 stack device units 21 and 22 together, adhesive 101 is cured. Curing adhesive 101 may include any procedures describe herein above with reference to FIGS. 3A-3D. After curing adhesive 101, clamping element 62 is released from back side 16 of tape substrate 12.

Figure 6D:
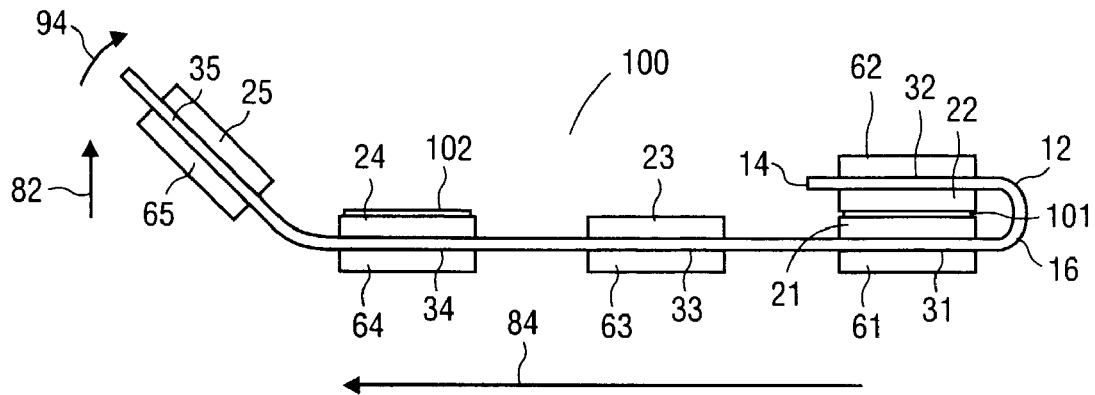

Clamping elements 61, 63, and 64 move in a fourth direction toward clamping element 65 as indicated by an arrow 84 in FIG. 6D. Clamping element 65 moves in second direction 82 and rotates in a direction indicated by an arrow 94 in FIG.

6D for approximately 180° to bend or fold tape substrate 12 and to place device unit 25 substantially facing device unit 24.

Figure 6E:
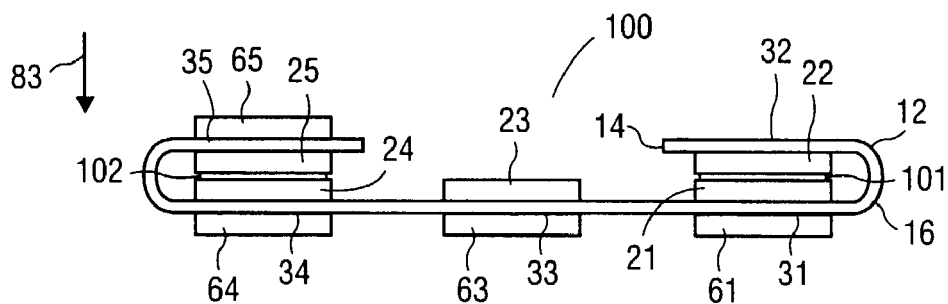

In FIG. 6E, clamping element 65 moves in third direction 83 to place device unit 25 in substantial contact with device unit 24. Adhesive 102 is cured and clamping element 65 is subsequently released from back side 16 of tape substrate 12.

Figure 6F:
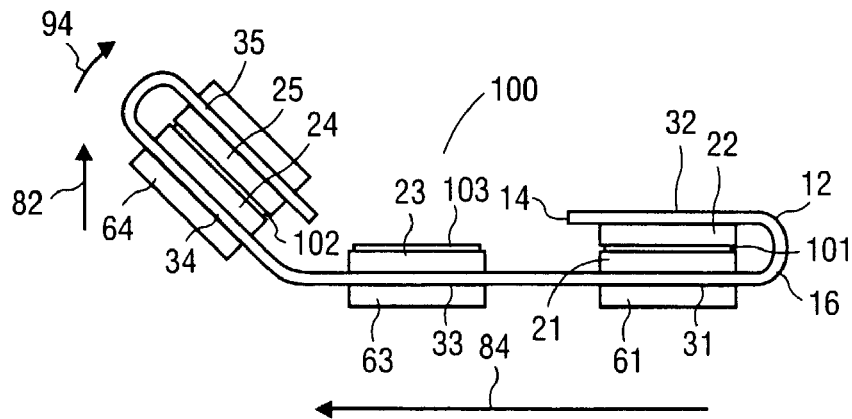

Next as shown in FIG. 6F, an adhesive 103 is applied on at least one of device unit 23 and back side 16 of tape substrate 12 in segment 35. Clamping elements 61 and 63 move in fourth direction 84 toward clamping element 64. Clamping element 64 moves in second direction 82 and rotates in direction 94 for approximately 180° to fold tape substrate 12 and to place segment 35 of tape substrate 12 substantially facing device unit 23.

Figure 6G:
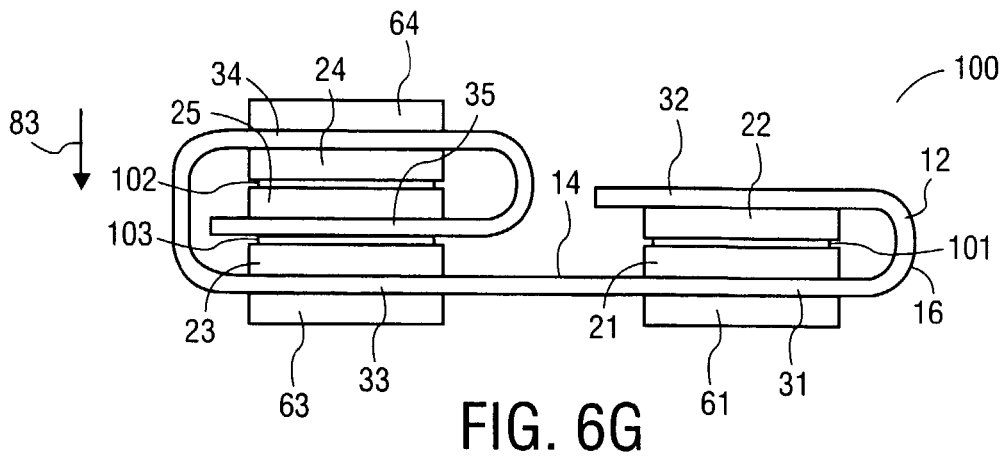

In FIG. 6G, clamping element 64 moves in third direction 83 to place segment 35 of tape substrate 12 in substantial contact with device unit 23. Clamping element 64 is released from back side 16 of tape substrate 12 after curing adhesive 103.

Figure 6H:
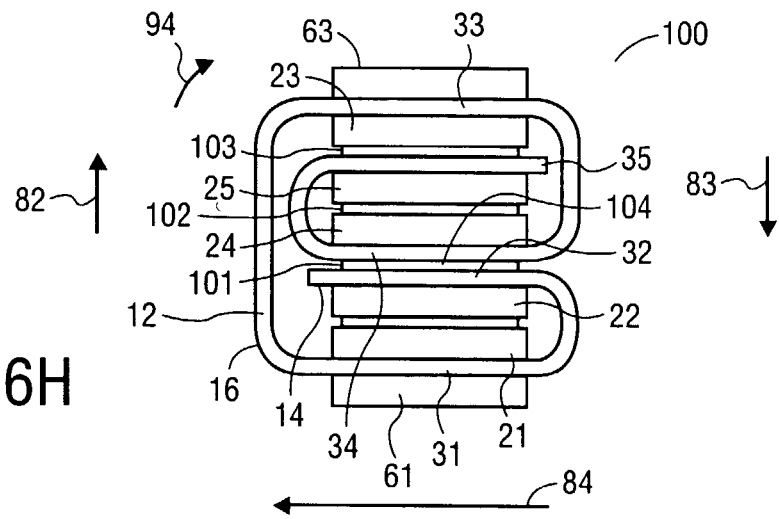

Next as shown in FIG. 6H, an adhesive 104 is applied on back side 16 of tape substrate 12 in at least one of segments 32 and 34. Clamping elements 61 moves in fourth direction 84 toward clamping element 63. Clamping element 63 moves in second direction 82 and rotates in direction 94 for approximately 180° to fold tape substrate 12 and to place segment 34 of tape substrate 12 substantially facing segment 32 of tape substrate 12. Then, clamping element 63 moves in third direction 83 to place segment 34 of tape substrate 12 in substantial contact with segment 32 of tape substrate 12. Adhesive 104 is cured. Clamping elements 61 and 63 are subsequently released from back side 16 of tape substrate 12.

Figure 7A:
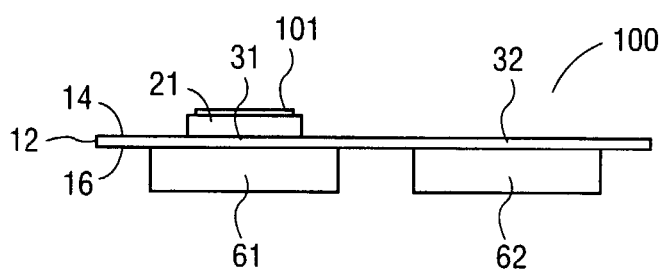
FIGS. 7A-7B illustrates one embodiment of a device packaging process in accordance with yet another aspect of the present invention.
Figure 7B:
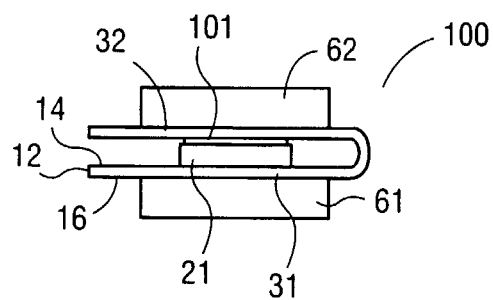

FIGS. 7A-7B illustrate a device packaging process in accordance with yet another embodiment of the present invention. The process uses a device packaging apparatus like apparatus 200 shown in FIG. 2 to packaging a device 100 having a single device unit 21 formed on front side 14 of tape substrate 12. Specifically, device unit 21 is formed in segment 31 of tape substrate 12. There is no device unit formed in segment 32 of tape substrate 12, which is adjacent to segment 31 of tape substrate 12.

First, as shown in FIG. 7A, segments 31 and 32 of tape substrate 12 are secured to clamping elements 61 and 62, respectively. An adhesive 101 is applied on device unit 21. Adhesive 101 can be a paste or fluid adhesive such as epoxy; it can also be an adhesive tape or film. It should be noted that adhesive 101 is not limited to being applied on device unit 21. In accordance with an embodiment of the present invention, adhesive can be applied on device unit 21, front side 14 of tape substrate 12 in segment 32, or both.

Next, as shown in FIG. 7B, at least one of clamping elements 61 and 62 moves and rotates to fold tape substrate 12 and stack segment 32 of tape substrate 12 over device unit 21. In one embodiment, front side 14 of tape substrate 12 in segment 32 is in good contact with adhesive 101 applied on device unit 21. This can be achieved by applying a force on device 100 through clamping elements 61 and 62 to press segment 32 of tape substrate 12 against device units 21. Adhesive 101 is cured. After curing adhesive 101, clamping elements 61 and 62 are detached or released from respective segments 31 and 32 of tape substrate 12.

The movements the clamping elements in first direction 81 and fourth direction 84 as described herein above with reference to FIGS. 3A-3D and 6A-6H avoid over stretching tape substrate 12. However, it should be noted that they are optional in accordance with the present invention. The over stretch of tape substrate 12 can also be avoided by moving the clamping element that is in rotation toward the rest of the clamping elements secured to the remaining segments of tape substrate 12.

It should be appreciated that an apparatus and a process for packaging a device with multiple units have been provided. A packaging apparatus in accordance with one embodiment of the present invention includes a plurality of robotic arms and a plurality of clamping elements attached to the robotic arms for clamping different segments of the tape substrate and folding the tape substrate, thereby stacking the device units together. In one embodiment of the present invention, the packaging apparatus also includes an element for applying adhesives on the device units and the tape substrate. Further, the packaging apparatus may include elements for facilitating the curing of the adhesive. When packaging a device with many device units on a tape substrate, in one embodiment, the two ends of the tape substrate one folded toward the central portion of the tape substrate. In alternative embodiments, the process may start from the central portion of the tape substrate. The packaging process and the apparatus of one embodiment of the present invention can be easily adapted for packaging devices with various characters and dimensions. The apparatus is capable of integrally performing different steps of the package process and handling the device with high precision. The device packaging process and the apparatus are applicable in various areas of semiconductor device manufacturing processes, such as, for example, chip scale packaging, memory device packaging, communication device packaging, etc.

While specific embodiments of the present invention have been described herein above, they are not intended as a limitation on the scope of the present invention. The present invention encompasses those modifications and variations of the described embodiments that are obvious to those skilled in the art. For example, although the specification describes the packaging processes for packaging devices with one, two, three, four, and five device units, these are not limitations on the present invention. The packaging process and apparatus of one embodiment of the present invention can package devices with any plural number of device units formed on a tape substrate. Further, the packaging process and apparatus of one embodiment of the present invention can also package devices with device units formed on both sides of the tape substrate. In addition, the application of the packaging process in accordance with alternative embodiments of the present invention is not limited to semiconductor device manufacturing. The packaging process and apparatus of alternative embodiments of the present invention can be used in any area that benefits from packaging at one or more units into a package.

What is claimed is:

1. A method of packaging multiple chips, comprising:
providing a flexible tape substrate having a thickness, a first side, a second side, a first segment, and a second segment;
providing a first clamping element and a second clamping element;
securing a first chip to the first side of the tape substrate to form a first capsule in the first segment of the tape substrate;
securing the first segment of the tape substrate to the first clamping element;
securing the second segment of the tape substrate adjacent the first segment to the second clamping element;
automatically moving at least one of the first clamping element and the second clamping element, relative to one another, in at least one direction while folding the tape substrate to stack the second segment over the first capsule; and controlling the first and second clamping elements to automatically move independently of one another while folding the tape substrate to account for the movement of each other and the dimensions of the first and second segments.

2. The method of claim 1, wherein moving at least one of the first clamp element and the second clamping element comprises:

moving the first clamping element horizontally in one direction; and simultaneously folding the tape substrate to stack the second segment of the tape substrate over the first capsule, maintaining an amount of slack in the tape substrate while the tape substrate is folded.

3. The method of claim 2, wherein folding the tape substrate comprises:

rotating the second clamping element for approximately 180 degrees; and moving the second clamping element to place the second segment of the tape substrate over the first capsule.

4. The method of claim 1 wherein:

securing the first segment of the tape substrate includes placing the second side of the tape substrate in the first segment over the first clamping element; and securing the second segment of the tape substrate includes placing the second side of the tape substrate in the second segment over the second clamping element, wherein the first and second clamping elements each comprise a vacuum chuck.

5. The method of claim 1 further comprising:

applying a first adhesive over at least one of the first capsule and the second segment of the tape substrate before moving at least one of the first segment and the second segment to stack the second segment over the first capsule.

6. The method of claim 5, wherein applying the first adhesive comprises heating and cooling the first adhesive.

7. The method of claim 5, wherein applying the first adhesive comprises irradiating the first adhesive with an electromagnetic radiation.

8. The method of claim 1 further comprising encapsulating a second chip to the first side of the tape substrate to form a second capsule on the second segment of the tape substrate.

9. The method of claim 8 further comprising:

encapsulating a third chip to the first side of the tape substrate to form a third capsule on a third segment of the tape substrate, the third segment being adjacent the first segment of the tape substrate;

securing the third segment of the tape substrate to a third clamping element, the third clamping element moving independently relative to the first and second clamping elements;

applying a second adhesive on at least one of the third capsule and the second side of the tape substrate in the second segment; and moving at least one of the second segment and the third segment to stack to join the third capsule with the second segment of the tape substrate.

10. The method of claim 9, wherein moving at least one of the second segment and the third segment to stack the third capsule with the second segment of the tape substrate comprises:

rotating the second clamping element in a first direction over approximately 180 degrees to orient the second capsule facing the first capsule;

moving the second clamping element to place the second capsule in contact with the first capsule;

releasing the second clamping element from the second segment of the tape substitute;

rotating the third clamping element in a second direction opposite to the first direction over approximately 180 degrees to orient the third capsule facing the second segment of the tape substrate; and moving the third clamping element to place the third capsule in contact with the second segment of the tape substrate.

11. The method of claim 10, further comprising:

encapsulating a fourth chip to the first side of the tape substrate to form a fourth capsule on a fourth segment of the tape substrate, the fourth segment being adjacent the third segment of the tape substrate;

securing the fourth segment of the tape substrate to a fourth clamping element, the fourth clamping element moving independently relative to the first, second, and third clamping elements;

applying a second adhesive on at least one of the third capsule and the fourth capsule;

folding the tape substrate to join the fourth capsule with the third capsule;

applying a third adhesive on at least one of the second segment and the fourth segment of the tape substrate; and folding the tape substrate to join the fourth segment with the second segment of the substrate tape.

12. A packaging process, comprising:

providing a flexible tape substrate having a thickness, a first side, a second side, a first segment, and a second segment;

providing a first clamping element and a second clamping element;

encapsulating a first chip to the first side of the tape substrate to form a first capsule in the first segment of the tape substrate;

securing the first segment of the tape substrate to the first clamping element;

securing the second segment of the tape substrate adjacent the first segment to the second clamping element;

automatically moving the second clamping element relative to the first clamping element to place the second segment of the tape substrate substantially facing the first segment;

automatically placing the second segment in contact with the first capsule; and controlling the first and second clamping elements to automatically move independently of one another to account for the movement of each other and the dimensions of the first and second segments.

13. The process of claim 12 wherein:

securing the first segment of the tape substrate includes placing the second side of the tape substrate in the first segment over the first clamping element; and securing the second segment of the tape substrate includes placing the second side of the tape substrate in the second segment over the second clamping element, wherein the first and second clamping elements each comprise a vacuum chuck.

14. The process of claim 12 further comprising:

encapsulating a third chip to the first side of the tape substrate to form a third capsule on a third segment of the tape substrate, the third segment being adjacent the first segment of the tape substrate;

securing the third segment of the tape substrate to a third clamping element, the third clamping element moving independently relative to the first and second clamping elements;

bending the tape substrate to join the third unit with the second section of the tape substrate:

moving the third clamping element to place a third unit facing the second section of the tape substrate; and moving the third clamping element to place the third unit in substantial contact with the second section of the tape substrate.

15. The process of claim 12 further comprising applying a first adhesive over at least one of the first capsule and the second segment of the tape substrate before placing the second segment in contact with the first capsule.

16. The process of claim 15, wherein applying the first adhesive comprises heating and cooling the first adhesive.

17. The process of claim 15, wherein applying the first adhesive comprises irradiating the first adhesive with an electromagnetic radiation.

* * * * *